(12) United States Patent
Su et al.

(10) Patent No.: US 8,624,346 B2
(45) Date of Patent: Jan. 7, 2014

(54) EXCLUSION ZONE FOR STRESS-SENSITIVE CIRCUIT DESIGN

(75) Inventors: Chao-Yuan Su, Koahsiung (TW); Chung-Yi Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1877 days.

(21) Appl. No.: 11/324,967

(22) Filed: Jan. 3, 2006

(65) Prior Publication Data
US 2007/0090547 A1   Apr. 26, 2007

Related U.S. Application Data

(60) Provisional application No. 60/725,493, filed on Oct. 11, 2005.

(51) Int. Cl.
*H01L 23/29* (2006.01)

(52) U.S. Cl.
USPC ............ 257/459; 257/793; 257/E23.142

(58) Field of Classification Search
USPC .......................................... 257/459
See application file for complete search history.

(56) References Cited

U.S. PATENT DOCUMENTS

| | | |
|---|---|---|
| 5,047,711 A | 9/1991 | Smith et al. |
| 5,096,855 A | 3/1992 | Vokoun, III |
| 5,136,364 A | 8/1992 | Byrne |
| 5,206,181 A | 4/1993 | Gross |
| 5,239,191 A | 8/1993 | Sakumoto et al. |
| 5,285,082 A | 2/1994 | Axer |
| 5,371,411 A | 12/1994 | Hara et al. |
| 5,751,065 A | 5/1998 | Chittipeddi et al. |
| 5,831,330 A | 11/1998 | Chang |
| 5,834,829 A | 11/1998 | Dinkel et al. |
| 6,022,791 A | 2/2000 | Cook et al. |
| 6,114,766 A | 9/2000 | Shields |
| 6,121,677 A | 9/2000 | Song et al. |

(Continued)

FOREIGN PATENT DOCUMENTS

| | | |
|---|---|---|
| CH | 1701418 A | 11/2005 |
| CN | 1542505 A | 11/2004 |

(Continued)

OTHER PUBLICATIONS

Pidin, S., et al. "MOSFET Current Drive Optimization Using Silicon Nitride Capping Layer for 65-nm Technology Node," 2004 Symposium on VLSI Technology Digest of Technical Papers, IEEE, Jul. 2004, pp. 54-55.

(Continued)

*Primary Examiner* — Zandra Smith
*Assistant Examiner* — Paul Patton
(74) *Attorney, Agent, or Firm* — Slater & Matsil, L.L.P.

(57) ABSTRACT

A semiconductor structure less affected by stress and a method for forming the same are provided. The semiconductor structure includes a semiconductor chip. Stress-sensitive circuits are substantially excluded out of an exclusion zone to reduce the effects of the stress to the stress-sensitive circuits. The stress-sensitive circuits include analog circuits. The exclusion zone preferably includes corner regions of the semiconductor chip, wherein the corner regions preferably have a diagonal length of less than about one percent of the diagonal length of the semiconductor chip. The stress-sensitive analog circuits preferably include devices having channel lengths less than about five times the minimum channel length.

23 Claims, 5 Drawing Sheets

(56) References Cited

U.S. PATENT DOCUMENTS

| | | |
|---|---|---|
| 6,284,657 B1 | 9/2001 | Chooi et al. |
| 6,300,223 B1 | 10/2001 | Chang et al. |
| 6,350,622 B2 | 2/2002 | Misewich et al. |
| 6,358,839 B1 | 3/2002 | Li et al. |
| 6,365,958 B1 | 4/2002 | Ibnabdeljalil et al. |
| 6,384,463 B1 | 5/2002 | Miles et al. |
| 6,483,173 B2 | 11/2002 | Li et al. |
| 6,492,716 B1 | 12/2002 | Bothra et al. |
| 6,495,918 B1 | 12/2002 | Brintzinger |
| 6,521,975 B1 | 2/2003 | West et al. |
| 6,566,736 B1 | 5/2003 | Ogawa et al. |
| 6,605,861 B2 | 8/2003 | Toyoda |
| 6,796,024 B2 | 9/2004 | Katoh et al. |
| 6,806,168 B2 | 10/2004 | Towle et al. |
| 6,841,455 B2 | 1/2005 | West et al. |
| 6,861,754 B2 | 3/2005 | Lin et al. |
| 6,861,755 B2 | 3/2005 | Hosoda et al. |
| 6,876,062 B2 | 4/2005 | Lee et al. |
| 6,876,064 B2 | 4/2005 | Matumoto et al. |
| 6,876,946 B2 | 4/2005 | Yasuda et al. |
| 6,939,736 B2 * | 9/2005 | Grabham et al. ............ 438/106 |
| 6,963,389 B2 | 11/2005 | Fukada |
| 6,998,712 B2 | 2/2006 | Okada et al. |
| 7,042,099 B2 | 5/2006 | Kurashima et al. |
| 7,087,452 B2 | 8/2006 | Joshi et al. |
| 7,126,225 B2 | 10/2006 | Su et al. |
| 7,126,255 B2 | 10/2006 | Yamaguchi et al. |
| 7,129,565 B2 | 10/2006 | Watanabe et al. |
| 7,129,566 B2 | 10/2006 | Uehling et al. |
| 7,135,384 B2 | 11/2006 | Takyu et al. |
| 7,138,297 B2 | 11/2006 | Iijima et al. |
| 7,138,700 B2 | 11/2006 | Tomita et al. |
| 7,145,211 B2 | 12/2006 | Mallikarjunaswamy et al. |
| 7,235,834 B2 | 6/2007 | Fukada |
| 7,235,864 B2 | 6/2007 | Lee |
| 7,259,445 B2 | 8/2007 | Lau et al. |
| 7,291,874 B2 | 11/2007 | Hsu |
| 7,294,937 B2 | 11/2007 | Su et al. |
| 7,335,577 B2 | 2/2008 | Daubenspeck et al. |
| 7,387,950 B1 | 6/2008 | Kuo et al. |
| 7,400,028 B2 | 7/2008 | Tomita |
| 7,407,835 B2 | 8/2008 | Chuang |
| 7,453,128 B2 | 11/2008 | Tsutsue et al. |
| 7,456,507 B2 | 11/2008 | Yang |
| 7,566,915 B2 | 7/2009 | Chang et al. |
| 7,646,078 B2 | 1/2010 | Jeng et al. |
| 7,763,887 B2 | 7/2010 | Han |
| 8,125,052 B2 | 2/2012 | Jeng et al. |
| 2001/0005604 A1 | 6/2001 | Lee et al. |
| 2001/0005617 A1 | 6/2001 | Feurle et al. |
| 2001/0008296 A1 * | 7/2001 | Gelsomini et al. ............ 257/500 |
| 2001/0019848 A1 | 9/2001 | Misewich et al. |
| 2002/0024115 A1 | 2/2002 | Ibnabdeljalil et al. |
| 2002/0130394 A1 | 9/2002 | Toyoda |
| 2003/0003677 A1 | 1/2003 | Fukada |
| 2004/0084777 A1 | 5/2004 | Yamanoue et al. |
| 2004/0119164 A1 | 6/2004 | Kurashima et al. |
| 2004/0150070 A1 | 8/2004 | Okada et al. |
| 2004/0150073 A1 | 8/2004 | Matumoto et al. |
| 2005/0009300 A1 | 1/2005 | Murari et al. |
| 2005/0017363 A1 | 1/2005 | Lin et al. |
| 2005/0026397 A1 | 2/2005 | Daubenspeck et al. |
| 2005/0098893 A1 | 5/2005 | Tsutsue et al. |
| 2005/0148115 A1 | 7/2005 | Williams et al. |
| 2005/0151239 A1 | 7/2005 | Lee |
| 2005/0230005 A1 | 10/2005 | Liang et al. |
| 2005/0269702 A1 | 12/2005 | Otsuka |
| 2005/0280120 A1 | 12/2005 | Tomita |
| 2006/0001144 A1 | 1/2006 | Uehling et al. |
| 2006/0012012 A1 | 1/2006 | Wang et al. |
| 2006/0022195 A1 | 2/2006 | Wang |
| 2006/0055002 A1 | 3/2006 | Yao et al. |
| 2006/0055007 A1 | 3/2006 | Yao et al. |
| 2006/0103025 A1 | 5/2006 | Furusawa et al. |
| 2006/0125090 A1 | 6/2006 | Chen et al. |
| 2006/0172457 A1 | 8/2006 | Huang |
| 2006/0192265 A1 | 8/2006 | Hsu |
| 2007/0018331 A1 | 1/2007 | Chen |
| 2007/0090447 A1 | 4/2007 | Morimoto et al. |
| 2007/0090547 A1 | 4/2007 | Su et al. |
| 2007/0158788 A1 | 7/2007 | Yang |
| 2008/0054263 A1 | 3/2008 | Han |
| 2008/0157284 A1 | 7/2008 | Chang et al. |
| 2008/0213938 A1 | 9/2008 | Kao |
| 2008/0265378 A1 | 10/2008 | Lee et al. |
| 2008/0283969 A1 | 11/2008 | Jeng et al. |
| 2008/0299708 A1 | 12/2008 | Tsutsue |
| 2009/0115024 A1 | 5/2009 | Jeng et al. |
| 2009/0115025 A1 | 5/2009 | Jung |
| 2009/0315184 A1 | 12/2009 | Tokitoh |
| 2009/0321890 A1 | 12/2009 | Jeng et al. |
| 2010/0123219 A1 | 5/2010 | Chen et al. |
| 2010/0207251 A1 | 8/2010 | Yu et al. |

FOREIGN PATENT DOCUMENTS

| | | |
|---|---|---|
| CN | 1770432 A | 5/2006 |
| CN | 1830079 A | 9/2006 |
| CN | 1956173 A | 5/2007 |

OTHER PUBLICATIONS

"Motorola MC7457RX1000NB Microprocessor," Sample Prep Delamination, Motorola Chipworks, Mar. 15, 2005, 1 page, Figure 3.1.3 Die Seal.

* cited by examiner

EXCLUSION ZONE FOR STRESS-SENSITIVE CIRCUIT DESIGN

This application claims priority to provisional patent application Ser. No. 60/725,493; filed on Oct. 11, 2005, entitled "Exclusion Zone for N90 Stress-Sensitive Circuit Design," which application is incorporated herein by reference.

TECHNICAL FIELD

This invention relates generally to integrated circuits, and more particularly to the fabrication of stress-sensitive integrated circuits.

BACKGROUND

With the advancement of modem technologies, integrated circuits having more functions and greater performance are increasingly demanded, which requires more semiconductor devices to be made for a circuit. A high degree of integration can be achieved in several ways, among which scaling semiconductor devices is the most commonly used method. Ninety (90) nm, 60 nm, and even 45 nm technologies have been used to produce very small devices having high performance. During packaging processes, two or more dies may be stacked together, and the dies may include integrated circuits having similar or completely different functions, so that both device number and functional circuit number can be increased. Typically, in order to stack more than one die into a package, the dies have to be thinned by a backside grinding process wherein the backsides or inactive sides of the dies are ground or polished until the dies are of desired thicknesses. Typically, wafers are thinned and cut into dies.

These methods have a side effect, however. Small devices, particularly devices fabricated using 90 nm technology or below, are more sensitive to stress. Not only is the performance of the devices affected, but undesired stress may also cause a malfunction of the semiconductor devices, affecting the reliability of the integrated circuit. Thinner dies, on the other hand, have increased stresses, further worsening the problem.

Conventionally, research was concentrated on reducing the stresses in dies. This includes increasing either the thickness of the dies or the thickness of the molding compound for packaging. However, due to the demand for thin dies, these methods have become less practical. Additionally, modification to packaging processes requires testing and debugging, thus increasing the cost and time to market. Functional tests may also be needed after the packaging processes, particularly on chips including stress-sensitive circuits, to ensure that integrated circuits function correctly.

Therefore, there is the need for novel approaches for reducing the effect of stress on integrated circuits.

SUMMARY OF THE INVENTION

The preferred embodiment of the present invention provides a method for fabricating a semiconductor structure having stress-sensitive circuits and a semiconductor structure fabricated using the method.

In accordance with one aspect of the present invention, the semiconductor structure includes a semiconductor chip. Stress-sensitive circuits are substantially excluded out of an exclusion zone on the chip to reduce the effects of the stress to the stress-sensitive circuits. The stress-sensitive circuits are preferably analog circuits. The exclusion zone preferably includes corner regions of the semiconductor chip, wherein the corner regions preferably have a diagonal length of less than about one percent of the diagonal length of the semiconductor chip.

In accordance with another aspect of the present invention, stress-sensitive analog circuits include devices having channel lengths less than about five times the minimum channel length.

In accordance with yet another aspect of the present invention, the exclusion zone further includes edge regions of the semiconductor chip.

In accordance with yet another aspect of the present invention, a method for forming the preferred embodiments of the present invention includes analyzing a circuit to be fabricated, determining stress-sensitive circuits, providing a semiconductor chip, determining an exclusion zone on the semiconductor chip, and forming substantially all stress-sensitive circuits outside the exclusion zone.

The advantageous features of the preferred embodiments of the present invention include full compatibility with existing integrated circuit fabrication processes with no extra process steps or cost involved. The performance and reliability of integrated circuits containing stress-sensitive circuits are improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
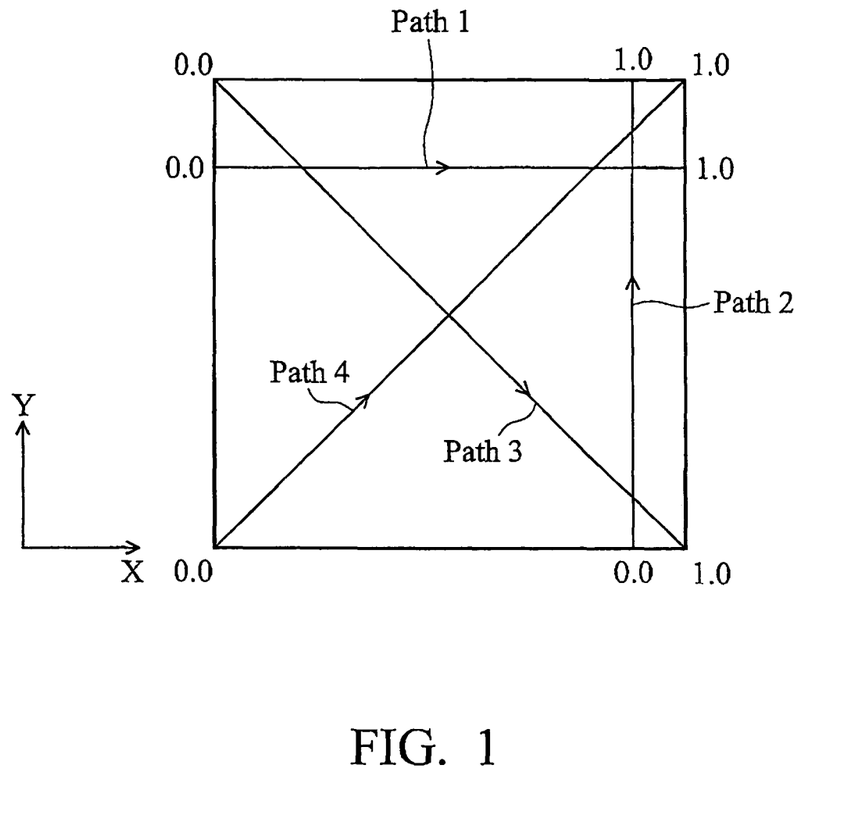
FIG. 1 illustrates a definition of straight paths and diagonal paths on a semiconductor chip.

Research has been conducted to analyze the stress on chips. FIG. 1 illustrates a semiconductor chip. Four paths, path 1, path 2, path 3 and path 4, are provided and respective stresses along the paths on the chip are simulated. Paths 1 and 2 are referred to as straight paths, wherein path 1 is parallel to the X-axis, and path 2 is parallel to the Y-axis. Path 3 and path 4 are diagonal paths along diagonal directions of the chip.

Figure 2:
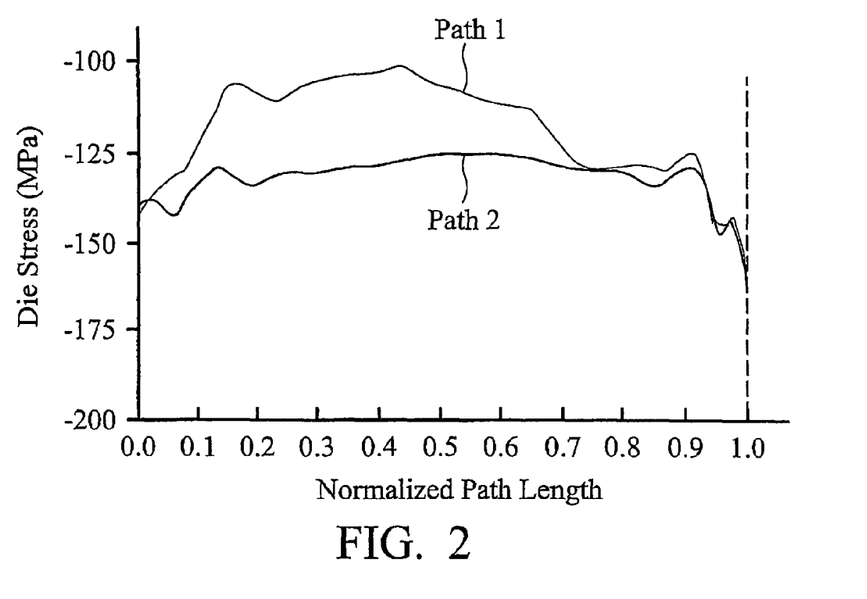
FIG. 2 illustrates a stress distribution on a chip along straight paths, wherein stresses on a chip are shown as functions of normalized path lengths.

FIG. 2 illustrates a stress distribution on a sample chip, wherein the die stresses are shown as functions of normalized path lengths along straight paths 1 and 2. The number 0.0 indicates the starting edge of a path and the number 1.0 indicates the ending edge of the path (refer to FIG. 1). It has been found that at the edges of the chip (normalized path lengths close to 0.0 or 1.0), the stress values are the greatest. A low-stress region exists proximate the center of path 1 and path 2 (normalized path lengths close to 0.5). Negative stress values indicate compressive stresses, although tensile stresses may be found on other sample chips.

Figure 3:
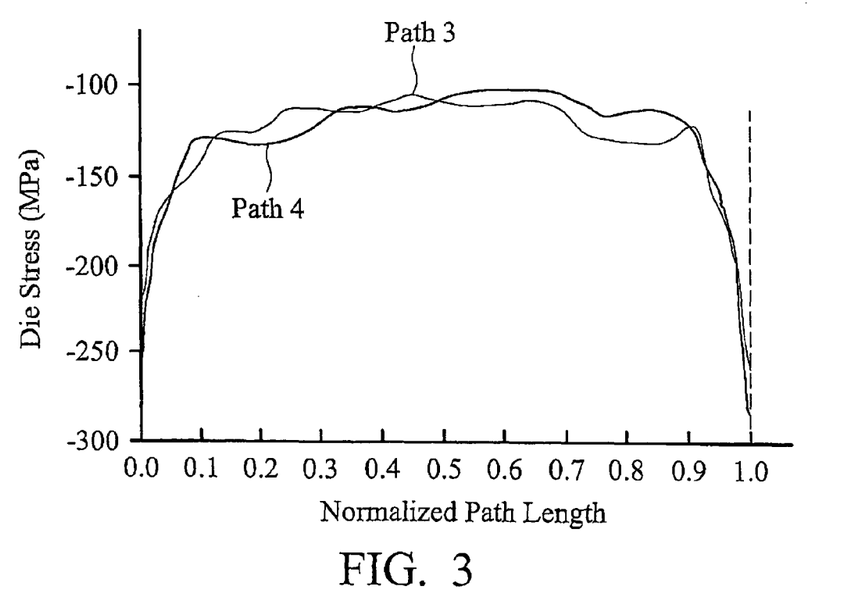
FIG. 3 illustrates a stress distribution on a chip along diagonal paths, wherein stresses on a die are shown as functions of normalized path lengths.

FIG. 3 illustrates the die stresses as functions of normalized path lengths along diagonal paths 3 and 4. Similarly, in the corner regions of the chip (normalized path lengths close to 0.0 or 1.0, refer to FIG. 1), the stress values are the greatest. A low-stress region exists close to the center of paths 3 and 4 (normalized path lengths close to 0.5). In the corner regions of the chip, the stresses are significantly greater than in the center region. Additionally, the stresses in the corner regions are significantly greater than the stresses in the edge regions.

Combining the results from FIGS. 2 and 3, it is concluded that stresses in corner regions of a chip are typically the greatest, while stresses in the center region are typically smaller. A chip thus can be divided into zones with respect to stress levels or locations.

Note that the results shown in FIG. 2 and FIG. 3 were obtained on a sample chip, and the distribution of stresses may be different on other chips. The stress distribution may be affected by various factors, such as the material of the substrate, the dimensions of the die, the materials of the inter-layer dielectric and the inter-metal dielectric, and the number of metallization layers. However, similar conclusions can be drawn in that corner regions of chips typically have the highest stresses, and center regions of chips have relatively low stresses.

In the preferred embodiments of the present invention, circuits to be fabricated on a chip are first analyzed and grouped as stress-sensitive circuits and non-stress-sensitive circuits. Stress-sensitive circuits are those circuits, if under stress, for which the performance and/or reliability are substantially affected in an undesirable way. Typically, analog circuits are more sensitive to stresses, and are more likely to be stress-sensitive circuits. Preferably, stress-sensitive circuits include phase-locked loop (PLL), digital-analog converter (DAC), analog-digital converter (ADC), regulator, filter, and the like, which are preferably used in electronic systems such as cellular phones, wireless application modules, PDAs, hand held devices, and image capturing devices.

One skilled in the art will realize, however, that the term "stress-sensitive" is a term of art, and its determination is affected by the technology used for fabricating the integrated circuit and design requirements. For example, an integrated circuit may be considered stress-sensitive if used in a high performance application, as a small degradation in performance will cause the circuit to fail to meet design requirements, while the same circuit will be non-stress-sensitive if low performance is required.

Devices having small channel lengths are more stress-sensitive, and circuits, particularly analog circuits comprising devices having small channel lengths, are preferably considered stress-sensitive circuits. The effect of stress to circuits was not significant in older generation integrated circuits. One of the reasons is that there was a lower performance requirement for older-generation integrated circuits. Another reason is that larger devices are less sensitive to stress. However, new generations of integrated circuits having smaller scales suffer more from stress problems. It is thus desirable to use the preferred embodiments of the present invention on the fabrication of small-scale circuits, for example, circuits with MOS devices fabricated using 90 nm, and preferably 65 nm, and even more preferably 45 nm technologies and below. In the preferred embodiment, analog circuits with channel lengths less than about ten times the minimum channel length of a MOS device are grouped as stress-sensitive circuits. In other embodiments, analog circuits with channel lengths less than about five times the minimum channel length of MOS devices are grouped as stress-sensitive circuits. For example, the minimum channel length for 65 nm technology is about 65 nm, and analog circuits having devices with channel lengths less than about 325 nm are therefore stress-sensitive circuits.

Stress in a chip is also related to the structure and materials of the chip. For example, chips fabricated using low-k materials (k value less than about 3) typically have high stresses. The formation of a high number of metallization layers or metallization layers with high stress such as copper layers also cause a higher likelihood of high stress. In one embodiment, chips fabricated using carbon-containing material as a low-k dielectric or using at least four copper metallization layers will suffer a high stress problem. In 90 nm, 60 nm or even 45 nm and below technologies, an ultra low-k dielectric (k less than about 2.7) and a high number of copper metallization layers (for example, more than eight copper metallization layers), stress becomes a critical issue while processing the semiconductor product. It is thus preferred to take these factors into account when analyzing and grouping circuits.

In the preferred embodiment, stress-sensitive circuits are substantially excluded out of exclusion zones, which have high stresses, and fabricated in remaining regions on the same chip. Non-stress-sensitive circuits, on the other hand, can be fabricated in both stress-sensitive zones and non-stress-sensitive zones.

Although the exclusion zones are preferably determined by stress levels, they can also be determined by locations on the chip due to the correlation between stress and location. FIGS. 4 through 7 are top views of a chip 20 with different exclusion zones. It is to be noted that FIGS. 4 through 7 are not drawn to scale, and in the practical case, the exclusion zones are likely to be smaller than shown.

Figure 4:
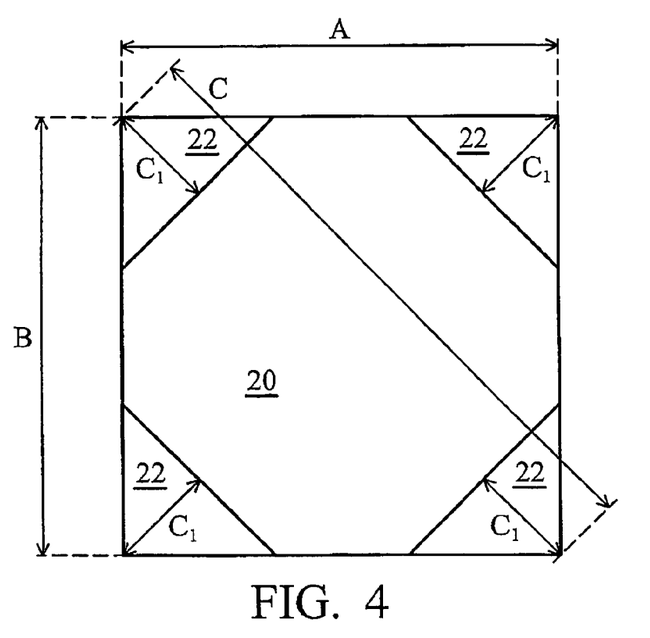
FIGS. 4 through 7 are top views of semiconductor chips showing different exclusion zones.

The preferred embodiment of the present invention is shown in FIG. 4. Chip 20 has a length A, a width B and a diagonal length C. Exclusion zones 22 include triangular corner regions of the chip 20. Preferably, the diagonal length $C_1$ of the exclusion zones 22 is greater than about one percent of the diagonal length C of chip 20, and more preferably greater than about two percent, and even more preferably greater than about five percent.

Figure 5:
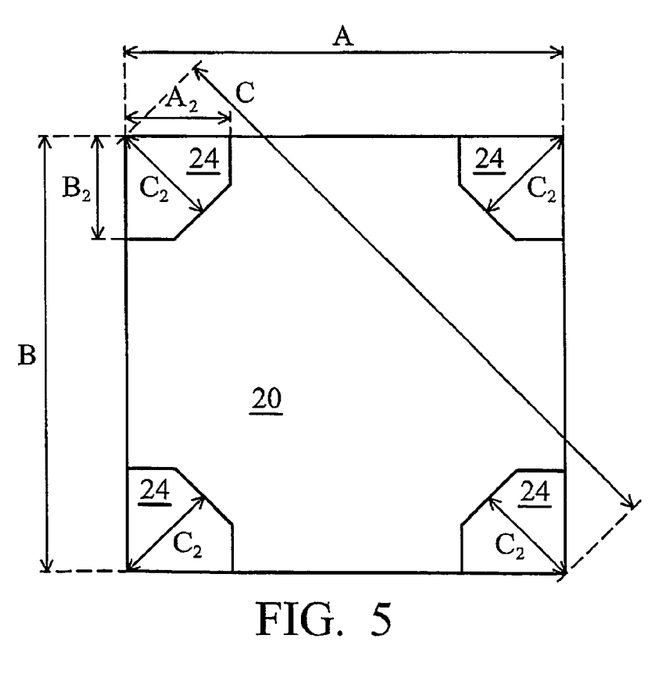

A variation of the preferred embodiment of the present invention is shown in FIG. 5. Exclusion zones 24 include corner regions of the chip 20. Similarly, the diagonal length $C_2$ of exclusion zones 24 is preferably greater than about one percent of the diagonal length C of the chip 20, and more preferably greater than about two percent of the diagonal length C, and even more preferably greater than about five percent of the diagonal length C. The length $A_2$ and the width $B_2$ of the exclusion zones 24 are preferably greater than about one percent of the length A and width B of the chip 20, respectively, and more preferably greater than about two percent.

Figure 6:
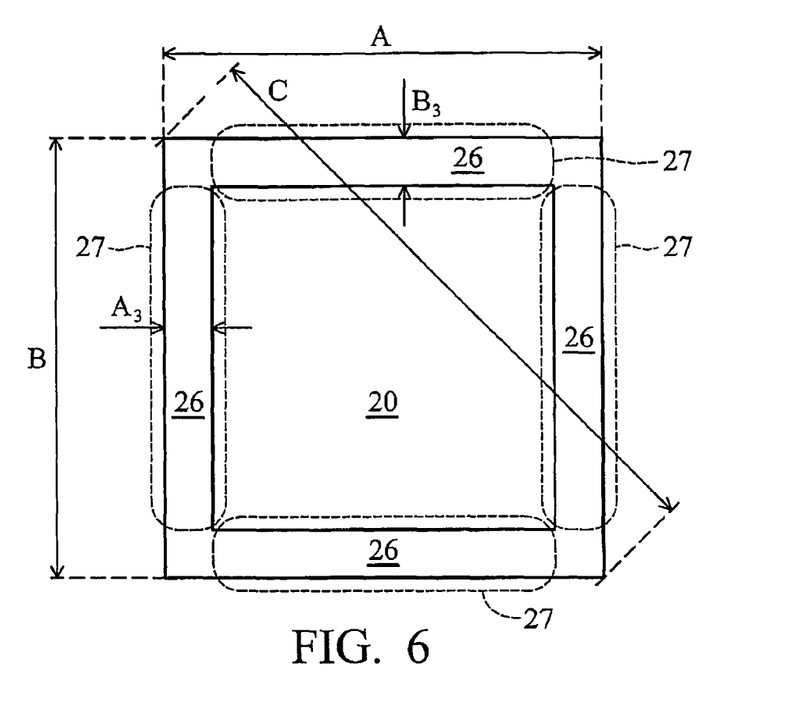
Figure 7:
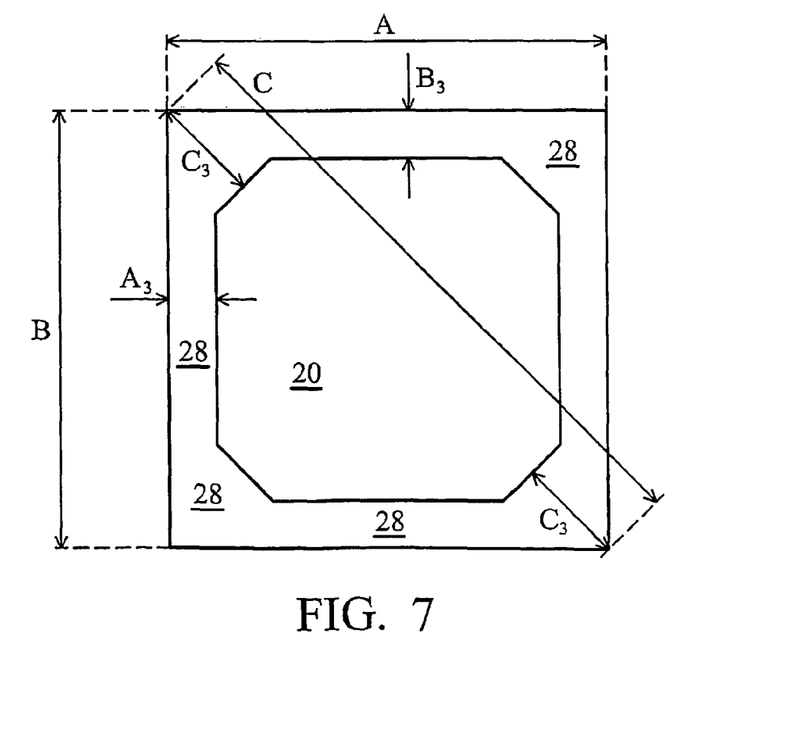

In a further variation of the preferred embodiment, as shown in FIG. 6, an exclusion zone 26 includes edge regions 27 and corner regions of chip 20, thus forming a continuous zone proximate the edges of the chip 20. FIG. 7 illustrates yet another preferred embodiment of the present invention, wherein an exclusion zone 28 is a continuous zone including larger corner regions than in FIG. 6. In both embodiments shown in FIGS. 6 and 7, the length $A_3$ and width $B_3$ of the exclusion zones 26 are preferably greater than about one percent of the length A and width B of the chip 20, respectively, and more preferably greater than about two percent. In the preferred embodiment shown in FIG. 7, the diagonal length $C_3$ is preferably greater than about one percent of the diagonal length C, and more preferably greater than about two percent, and even more preferably greater than about five percent.

It is appreciated that the optimal locations and dimensions of the exclusion zones are affected by factors such as the material of the substrate, the dimensions of the die, etc. as previously discussed. A determination of exclusion zones thus preferably includes measuring stresses on chips with similar dimensions and materials, and determining an acceptable stress level for stress-sensitive circuits according to design specifications.

The fabrication of the integrated circuits is also affected by the chip (also referred to as a die in the packaging art) thickness and packaging processes. Preferably, if a chip has a thickness of less than about 200 µm, stress-sensitive circuits are preferably determined and fabricated out of the exclusion zones.

Figure 8:
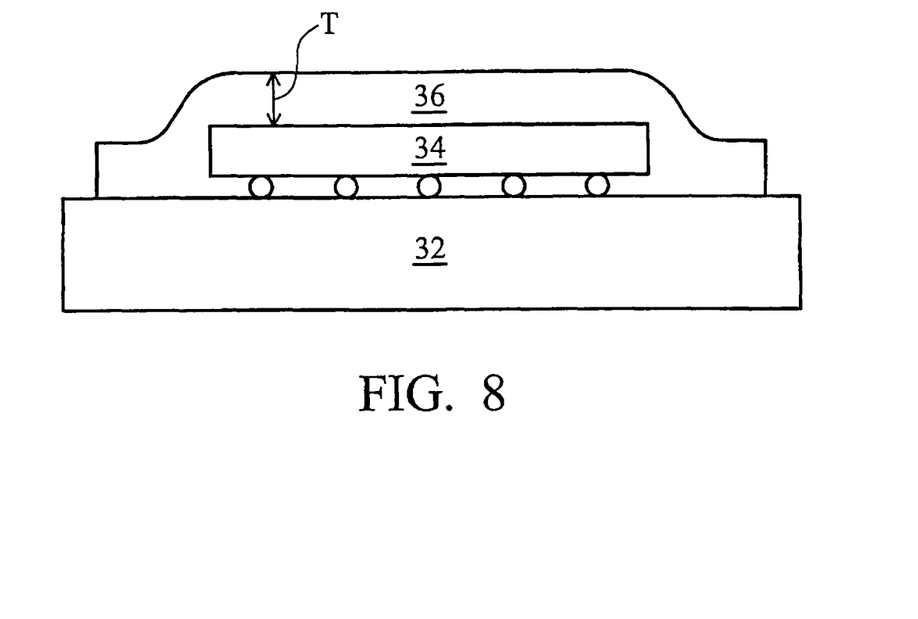
FIG. 8 illustrates a cross-sectional view of a semiconductor package containing one die.

FIG. 8 illustrates a schematic cross-sectional view of a semiconductor package, which includes a die 34 mounted on a package substrate 32. Molding compound 36 covers the die 34. Typically, molding compound 36 helps reduce the stress in die 34, and the thicker the molding compound 36 is, the less stress remains in die 34. Preferably, if the thickness T of molding compound 36 is less than about 300 µm, stress in die 34 is likely to be high, and stress-sensitive circuits are preferably formed out of the exclusion zones of the respective die 34.

Figure 9:
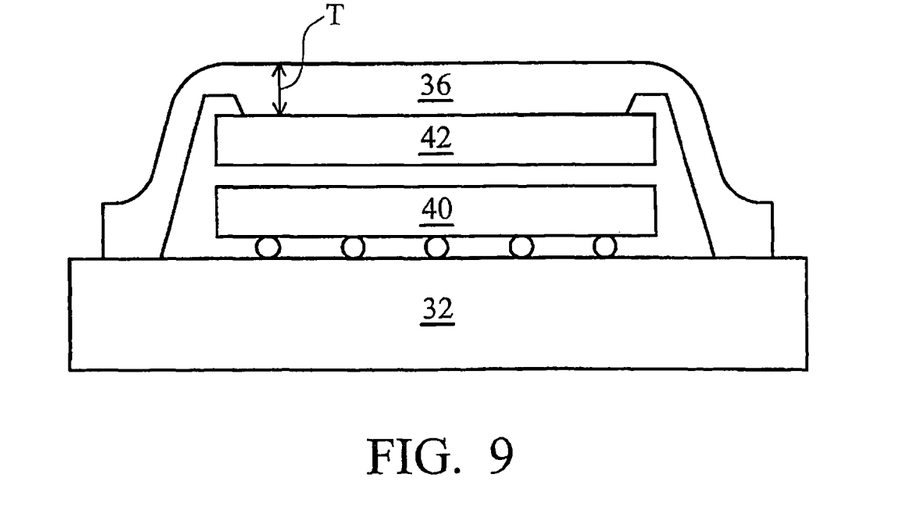
FIG. 9 illustrates a cross-sectional view of a semiconductor package containing stacked dies.

FIG. 9 illustrates a stacked die with dies 40 and 42 mounted on a substrate 32. More dies may be included, although only two dies are shown. Since stacked dies are typically thin, stresses in stacked dies are typically high. Likewise, if molding compound 36 has a thickness T of less than about 300 µm, stress-sensitive circuits are preferably formed out of the exclusion zone in respective dies.

The preferred embodiments of the present invention are fully compatible with existing integrated circuit fabrication processes. No extra process steps or cost is involved. The performance and reliability of integrated circuits containing stress-sensitive circuits are improved. Time to market is reduced. Additionally, the preferred embodiments of the present invention provide a guideline for the manufacture of stress-sensitive circuits.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
   corner regions and a center region; and
   an exclusion zone comprising the corner regions of the semiconductor chip, wherein the corner regions have a diagonal length of greater than about one percent of a diagonal length of the semiconductor chip, wherein analog circuits are excluded out of the exclusion zone.

2. The semiconductor chip of claim 1, wherein the diagonal length of the corner regions is greater than about two percent of a diagonal length of the semiconductor chip.

3. The semiconductor chip of claim 1, wherein the diagonal length of the corner regions is greater than about five percent of the diagonal length of the semiconductor chip.

4. The semiconductor chip of claim 1, wherein the exclusion zone further comprises edge regions of the semiconductor chip, wherein the edge regions have a length and a width greater than about one percent of a length and a width of the semiconductor chip, respectively.

5. The semiconductor chip of claim 1, wherein the analog circuits comprise devices with channel lengths less than about ten times a minimum channel length.

6. An electronic device comprising:
   a semiconductor chip including corner regions, edge regions and a center region;
   an exclusion zone comprising the corner regions; and
   a plurality of analog circuits on the semiconductor chip, wherein all analog circuits having MOS devices with channel lengths less than about ten times a minimum channel length are formed outside the exclusion zone.

7. The electronic device of claim 6, wherein all analog circuits are formed outside the exclusion zone.

8. The electronic device of claim 6, wherein the electronic device is a cellular phone.

9. The electronic device of claim 6, wherein the electronic device comprises a wireless application module.

10. The electronic device of claim 6, wherein the semiconductor chip has a thickness of less than about 200 µm.

11. The electronic device of claim 6, wherein the electronic device further comprises a stacked-chip package with an additional chip overlying the semiconductor chip.

12. The electronic device of claim 6, wherein the electronic device further comprises a carbon-containing layer overlying a substrate of the semiconductor chip.

13. A semiconductor chip package comprising:
   a semiconductor chip having a thickness of less than about 200 µm comprising:
      an exclusion zone comprising corner regions of the chip, wherein the corner regions have a diagonal length of less than about one percent of a diagonal length of the semiconductor chip; and
      analog circuits comprising MOS devices, wherein all analog circuits having MOS devices with channel lengths less than about ten times a minimum channel length are excluded out of the exclusion zone; and
   a molding compound overlying the semiconductor chip.

14. The semiconductor chip package of claim 13, wherein all analog circuits are excluded out of the exclusion zone.

15. The semiconductor chip package of claim 13, wherein the molding compound has a thickness of less than about 300 µm.

16. The semiconductor chip package of claim 13 further comprising an additional semiconductor chip stacked over the semiconductor chip.

17. The semiconductor chip package of claim 13, wherein the semiconductor chip comprises at least four copper layers overlying a substrate.

18. The semiconductor chip package of claim 17, wherein the semiconductor chip comprises at least eight copper layers overlying a substrate.

19. The semiconductor chip package of claim 13, wherein the minimum channel length is about 90 nm or less.

20. The semiconductor chip package of claim 13, wherein the molding compound has a thickness of less than about 300 µm.

21. The electronic device of claim 1 further comprising non-stress-sensitive devices in the exclusion zone.

22. The electronic device of claim 6 further comprising non-stress-sensitive devices in the exclusion zone.

23. The semiconductor chip package of claim 13 further comprising non-stress-sensitive devices in the exclusion zone.

\* \* \* \* \*